US012724160B2

(12) United States Patent
Mukherjee et al.

(10) Patent No.: US 12,724,160 B2
(45) Date of Patent: Sep. 1, 2026

(54) PROTON DOSIMETER

(71) Applicant: DIGANTARA RESEARCH AND TECHNOLOGIES PRIVATE LIMITED, Kotdwara (IN)

(72) Inventors: Bhaskar Mukherjee, Sydney (AU); Tanveer Ahmed, Bengaluru (IN); Anirudh N Sharma, Bengaluru (IN); Rahul Rawat, Kotdwara (IN)

(73) Assignee: Digantara Industries Private Limited, Bangalore (IN)

( * ) Notice: Subject to any disclaimer, the term of this patent is extended or adjusted under 35 U.S.C. 154(b) by 227 days.

(21) Appl. No.: 18/291,309

(22) PCT Filed: Sep. 15, 2021

(86) PCT No.: PCT/IN2021/050911
§ 371 (c)(1),
(2) Date: Jan. 23, 2024

(87) PCT Pub. No.: WO2023/002495
PCT Pub. Date: Jan. 26, 2023

(65) Prior Publication Data

US 2024/0361470 A1 Oct. 31, 2024

(30) Foreign Application Priority Data

Jul. 23, 2021 (IN) ............................ 202111033258

(51) Int. Cl.

| | |
|---|---|
| ***G01T 1/02*** | (2006.01) |
| ***H10F 30/29*** | (2025.01) |
| *G01T 7/12* | (2006.01) |

(52) U.S. Cl.
CPC ............ *G01T 1/026* (2013.01); *H10F 30/29* (2025.01); *G01T 7/12* (2013.01)

(58) Field of Classification Search
None
See application file for complete search history.

(56) References Cited

U.S. PATENT DOCUMENTS

2012/0061591 A1 3/2012 Yoder et al.

OTHER PUBLICATIONS

Bhaskar Mukherjee et al., 69th International Astronautical Congress, RAVI-2017: A solar proton fluence monitor for LEO nanosatellite missions based on COTS electronics (2018).

*Primary Examiner* — Marcus H Taningco
(74) *Attorney, Agent, or Firm* — Jose Cherson Weissbrot

(57) ABSTRACT

According to an embodiment herein, a method of fabricating (100) a proton dosimeter (200) including; filing off (104) a frontal surface of a light emitting diode (LED) (120) and a frontal surface of a light-to-frequency converter (LFC) (124); exposing a plurality of first sensitive zone (122) of the LED (120) and a plurality of second sensitive zone (123) of the LFC (124); bonding (108) the plurality of first sensitive zones (122) and the plurality of second sensitive zones (123) by acrylic glue; wrapping (110) the sensitive zone interface of the LED (120) and the LFC (124) in a metal foil (111) and a polymer tape (113); and filling a gap between the metal foil (111) and a plurality of terminal leads (115) of the LED (120) and the LFC (124) with acrylic polymer aliquots (125).

20 Claims, 9 Drawing Sheets

PROTON DOSIMETER

FIELD OF THE INVENTION

The present embodiment relates to a proton dosimeter for measuring proton doses, in particular, to the proton dosimeter incorporating a light emitting diode and a light-to-frequency converter.

BACKGROUND OF THE INVENTION

There are certain requirements for measuring the intensity of radiation present in a specific region. Outer space is flooded with ionising radiations composed of: (a) Galactic Cosmic Radiation (GCR) ~87% high-energy protons, 12% helium nuclei and an assortment of heavy charged (HZE) particles, (b) Trapped radiation field in the Van Allen belt (VAB) surrounding our earth made of energetic (1 keV-250 MeV) protons and low energy (up to 10 MeV) electrons, (c) Solar flares or solar particle events (SPE) originated in solar corona made of 95% protons, 4% helium nuclei, <1% electron and <1% HZE particles (1). The primary source of ionising radiations in LEO space is energetic protons from the Sun; furthermore during the sporadic occurrence solar flares the intensity of the proton flux escalates drastically.

In normal (static) conditions the solar proton fields in LEO environment are predicted by ionising radiations inflict detrimental effects in electronics. Hence, all vitally important electronic components belong to orbiting spacecrafts exposed to space radiations are prone to radiation induced performance degradation or permanent (irreversible) damage. The intensity of proton radiation when exceeded beyond a certain threshold may cause severe damage to electronic circuitry such as chips etc.

There are other requirements that indicate the need to calculate the proton dose such as in medical applications in evaluating the health risks due to various diseases such as leukaemia, cancer, cataract etc. The method steps for calculating proton radiation are not configured to predict risk for various diseases and get collapsed when subjected to certain unfavourable conditions.

Keeping in view the intricacies involved in such proton radiation measurements, there is a need for accurate and precise way for calculation of proton radiations.

SUMMARY OF THE INVENTION

In view of the foregoing, a method of fabricating (100) a proton dosimeter including; filing off (104) a frontal surface of a light emitting diode (LED) (120) and a frontal surface of a light-to-frequency converter (LFC) (124); exposing a plurality of first sensitive zone (122) of the LED (120) and a plurality of second sensitive zone (123) of the LFC (124); bonding (108) the plurality of first sensitive zones (122) and the plurality of second sensitive zones (123) by acrylic glue; wrapping (110) the sensitive zone interface of the LED (120) and the LFC (124) in a metal foil (111) and a polymer tape (113); and filling a gap between the metal foil (111) and a plurality of terminal leads (115) of the LED (120) and the LFC (124) with acrylic polymer aliquots (125).

In an embodiment the method (100) further includes sealing of the proton dosimeter (102) by a heat-shrinking sleeve (117). In an embodiment, the metal foil (111) is an aluminium foil wrapping the sensitive zone interface of the LED (120) and the LFC (124) after curing period of 30 minutes. In an embodiment, the polymer (113) is a PVC insulation tape. In an embodiment, the LED (120) is Ga (As) LED of model number LN48YPX. In an embodiment, the LFC (124) is of model number TSL235R.

In an aspect, a proton dosimeter (200) including a light emitting diode (LED) (120) communicating with a light-to-frequency converter (LFC) (124) through a sensitive zone interface of the LED (120) and the LFC (124). The sensitive zone interface is prepared by joining a number of first sensitive zone (122) of the LED (120) and a number of second sensitive zone (123) of the LFC (124) by a heat resistant acrylic glue and the sensitive zone interface wrapped in a metal foil (111) and a polymer tape (113).

In an embodiment, a gap between a plurality of terminal leads (115) of the LED (120) and the LFC (124) and the metal foil (111) is filled with acrylic polymer aliquots (125).

In an embodiment, the sensitive zone interface of the LED (120) and the LFC (124) is sealed using a heat-shrinking sleeve (117).

In an embodiment, the LFC (124) is configured to convert the proton induced light output of the LED (120) into a frequency output.

In an embodiment, the metal foil (111) is an aluminum foil wrapped around the LED (120) and the LFC (124) after the curing period of 30 minutes.

In an aspect, a dosing mechanism (300) for dosing a proton radiation from a proton dosimeter (200) including exposing a depletion zone (122) of an LED (120) to the proton radiation. Impinging the proton radiation on the depletion zone (122) of the LED (120) leads to formation of a plurality of non-radiative-recombination-centres (306) in the depletion zone (304) that further reducing the light output (305) of the LED (120) and converting the light output (305) of the LED (120) to a frequency output (307) by a light-to-frequency converter (LFC) (124). Calculating a proton fluence based on the frequency output (307) of the LFC (124) of the proton dosimeter (200).

In an embodiment, the LFC (124) is further configured with a signal conditioner (308) for conditioning the converted signals.

In an embodiment, a number of first sensitive zones (122) of the LED (120) and a number of second sensitive zones (123) of the LFC (124) are joined together by acrylic glue to form a sensitive zone interface of the LED (120) and the LFC (124).

In an embodiment, the sensitive zone interface of the LED (120) and the LFC (124) is wrapped by a metal foil (111) and a polymer tape (113).

In an embodiment, a gap between the metal foil and a plurality of terminal leads (115) of the LED (120) and the LFC (124) are filled with acrylic polymer aliquots (125).

In another aspect, a method of assessing (500) risk factors of a proton radiation includes detection and conversion (502) of a proton radiation output of a light emitting diode (LED) (120) of a proton dosimeter (200) into a frequency output by a light-to-frequency converter (LFC) (124) of the proton dosimeter (200) calculating (504) proton fluence based on the frequency output of the LFC (124) of the proton dosimeter (200) by the fluence calculator (520); converting (506) the proton fluence into a proton dose; applying a plurality of application specific dose conversion factors to the proton dose; evaluating (510) the proton dose based on a plurality of application specific proton dose conversion factors.

In an embodiment, a number of first sensitive zones (122) of the LED (120) and a number of second sensitive zones (123) of the LFC (124) are bonded together by acrylic glue to prepare a sensitive zone interface of the LED (120) and the LFC (124).

In an embodiment, the sensitive zone interface of the LED (120) and the LFC (124) is wrapped with a metal foil (111) and a polymer tape (113).

In an embodiment, a gap between a plurality of terminal leads (115) of the LED (120) and the LFC (124) and the metal foil (111) is filled with acrylic polymer aliquots (125).

BRIEF DESCRIPTION OF DRAWINGS

The above and still further features and advantages of embodiments of the present invention becomes apparent upon consideration of the following detailed description of embodiments thereof, especially when taken in conjunction with the accompanying drawings, and wherein.

To facilitate understanding, like reference numerals have been used, where possible, to designate like elements common to the figures.

DETAILED DESCRIPTION OF THE DRA WINGS

Figure 1:
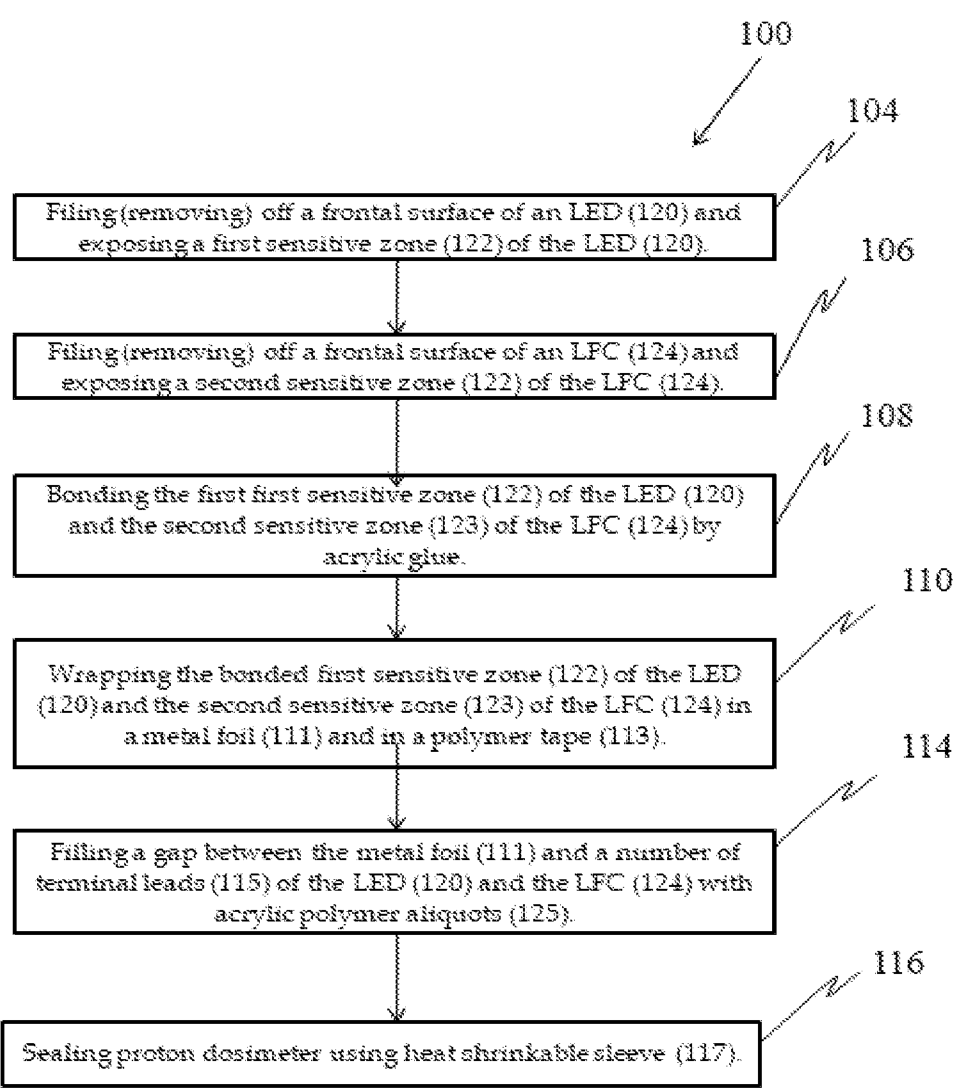
FIG. 1 is a flow chart for the fabrication of a proton dosimeter according to an embodiment herein.

Various embodiment of the present invention provides a proton dosimeter. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

The various embodiments including the example embodiments are now described more fully with reference to the accompanying drawings, in which the various embodiments of the invention are shown. The invention may, however, be embodied in different forms and should not be construed as limited to the embodiments set forth herein. Rather, these embodiments are provided so that this disclosure is thorough and complete, and fully conveys the scope of the invention to those skilled in the art. In the drawings, the sizes of components may be exaggerated for clarity.

It is understood that when an element or layer is referred to as being "on," "connected to," or "coupled to" another element or layer, it can be directly on, connected to, or coupled to the other element or layer or intervening elements or layers that may be present. As used herein, the term "and/or" includes any and all combinations of one or more of the associated listed items.

Spatially relative terms, such as "top," "bottom," and the like, may be used herein for ease of description to describe one element or feature's relationship to another element(s) or feature(s) as illustrated in the figures. It is to be understood that the spatially relative terms are intended to encompass different orientations of the structure in use or operation in addition to the orientation depicted in the figures.

The terms "sensitive zone", sensitive zones", "a number of sensitive zones" and "a plurality of sensitive zones" may be used herein to indicate the depletion zone of the semiconductor chip used in any electronic circuitry or a chipset.

The terms "exposed sensitive zone", "exposing sensitive zone", "number of exposed sensitive zone" and "number of exposing sensitive zone" may be used herein to indicate the depletion zone of the electronic circuitry which can be accessed to join/attach/affix/bond/tether/communicate/couple depletion zone of any other electronic component or circuitry for enabling an operative connection between the electronic components that causes an information flow within the electronic device, circuit or the like.

The terms "sensitive zone interface" may be used herein to indicate the joint/junction/bonding/bonded/attached/coupled two or more depletion zones of two or more different electronic components.

The terms "sensitive zone" and "depletion zone" used herein the present disclosure means the common meaning of the depletion layer of the diode, that is the region in a semiconductor chip where no mobile carriers are present. The terms "sensitive zone and "depletion zone" may be used interchangeably herein the present disclosure.

Embodiments described herein refer to plan views and/or cross-sectional views by way of ideal schematic views. Accordingly, the views may be modified depending on simplistic assembling or manufacturing technologies and/or tolerances. Therefore, example embodiments are not limited to those shown in the views but include modifications in configurations formed on basis of assembling process. Therefore, regions exemplified in the figures have schematic properties and shapes of regions shown in the figures exemplify specific shapes or regions of elements, and do not limit the various embodiments including the example embodiments.

The subject matter of example embodiments, as disclosed herein, is described with specificity to meet statutory requirements. However, the description itself is not intended to limit the scope of this patent. Rather, the inventors have contemplated that the claimed subject matter might also be embodied in other ways, to include different features or combinations of features similar to the ones described in this document, in conjunction with other technologies. Generally, the various embodiments including the example embodiments relate to a proton dosimeter for measuring proton radiations.

The present embodiment relates to a proton dosimeter incorporating a light-to-frequency converter.

FIG. 1 illustrates a flow chart for the fabrication steps (100) of a proton dosimeter. The method of fabrication (100) includes:—

Filing (removing) off (104) a frontal surface of a light emitting diode (LED) (120) and exposing a first sensitive zone (122) of the LED (120).

Filing (removing) off (106) a frontal surface of a light-to-frequency (LFC) converter (124) and exposing a second sensitive zone (123) of the LFC (124).

Bonding (108) the first sensitive zone (122) of the LED (120) and the second sensitive zone (123) of the LFC (124) by heat resistant acrylic glue.

Wrapping (110) the sensitive zone interface of the LED (120) and the LFC (124) in a metal foil (111) after curing of the LED (120) and LFC (124) interface for at least 30 minutes and in a polymer tape (113).

Filling (114) a gap between the metal foil (111) and a number of terminal leads (115) of the LED (120) and the LFC (124) with acrylic polymer aliquots (125).

Sealing (116) the proton dosimeter using a heat shrinkable sleeve (HSS) (117).

The method steps as disclosed above are used in the fabrication of the proton dosimeter incorporating the LFC (124). The first sensitive zone (122) of the LED (120) and the second sensitive zone (123) of the LFC (124) when bonded, exhibits almost negligible gap between them and, therefore: a negligible gap between the LED (120) and the LFC (124) is left behind. The metal foil (111) wrapped around the sensitive zone interface of the LED (120) and the LFC (124) of the proton dosimeter is configured to enhance the light collection efficiency. The polymer tape (113) wrapped around the sensitive zone interface of the LED (120) and the LFC (124) of the proton dosimeter is configured to cut-off or blocks the undesired ambient light while dosing the proton radiation that could cause interference in the proton induced optical signals generated by the LED (120).

In an embodiment, the number of first sensitive zones (122) of the LED (120) may be exposed to join or bond with the number of second sensitive zones (123) of the LFC (124).

In an embodiment, the polymer tape (113) is a black PVC insulation tape of thickness 0.5 mm.

In an embodiment, the metal foil (111) is an aluminium foil of thickness 0.6 mm and is configured to provide an efficient shielding for the proton dosimeter (102), in particular to the LFC (124) from the radio-frequency field that is prevalent in a spacecraft.

In an embodiment, the acrylic polymer aliquot ensures a structural integrity of the proton dosimeter (102) under high “G” (acceleration) that is prevalent during various phases of the deployment of the spacecraft. The structural integrity achieved due to the polymer aliquot thus eliminates the possibility of self-destruction of the proton dosimeter (102). The polymer aliquot also eliminates the interference with the dosimetric property of the proton dosimeter (102).

In an embodiment, the LED (120) used in the fabrication (100) of the proton dosimeter (102) is a Ga (As) LED of model number LN48YPX.

In an embodiment, the LFC (124) used in the fabrication (100) of the proton dosimeter (102) is of model number TSL235R.

Figure 2:
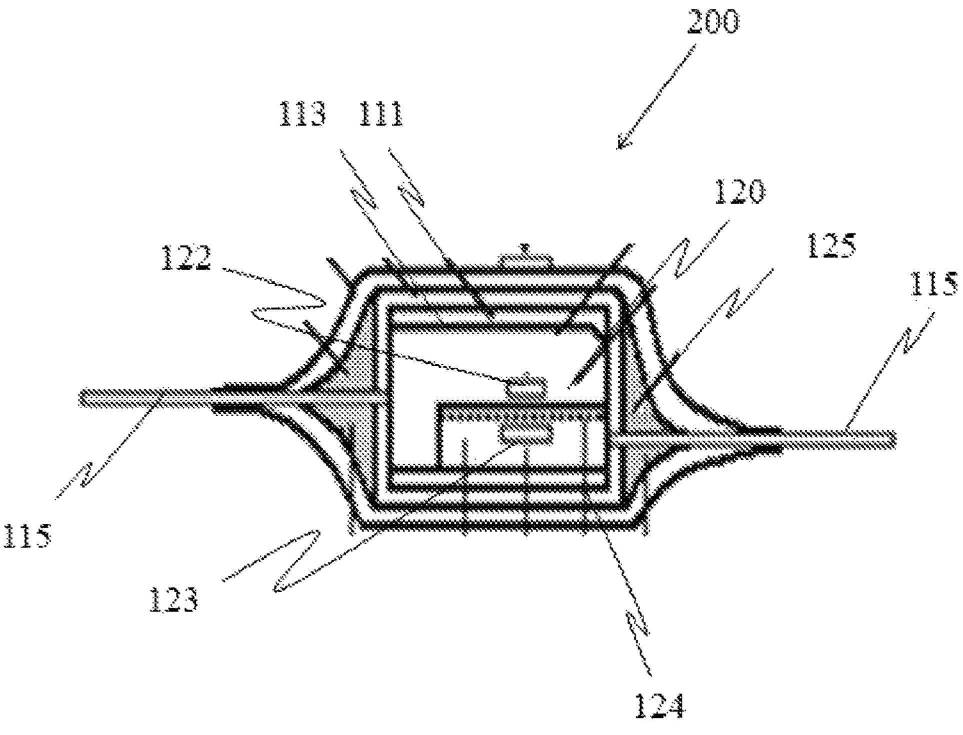
FIG. 2 is a sectional front view of a proton dosimeter according to an embodiment herein.

FIG. 2 illustrates a proton dosimeter (200) configured to detect the proton radiation in a specific region. The proton dosimeter (200) includes a light emitting diode (LED) (120), a light-to-frequency (LFC) converter (124), a metal foil (111) and a polymer tape (113).

The LED (120) further includes a first sensitive zone (122) and the LFC (124) further includes a second sensitive zone (123) and the number of terminal leads (115). A frontal surface of the LED (120) and the LFC (124) of the proton dosimeter (200) are filed off to expose the first sensitive zone (122) of the LED (120) and the second sensitive zone (123) of the LFC (124). The first sensitive zone (122) and the second sensitive zone (124) are joined together with acrylic glue to prepare the sensitive zone interface of the LED (120) and the LFC (124). The metal foil (111) is wrapped around the sensitive zone interface of the LED (120) and the LFC (124) of the proton dosimeter (200) to enhance the light collection efficiency of the proton dosimeter (200). The polymer tape (113) is wrapped around the sensitive zone interface of the LED (120) and the LFC (124) of the proton dosimeter (200) to cut-off or blocks the undesired ambient light while dosing the proton radiation that could cause interference to the proton induced optical signals generated by the LED (120). The gap between the metal foil and the number of terminal leads (115) of the LED (120) and the LFC (124) is filled with acrylic polymer aliquots (125). The sensitive zone interface of the LED (120) and the LFC (124) is sealed by a heat shrink sleeve for enabling the overall protection of the proton dosimeter (200).

In an embodiment, the number of first sensitive zones (122) of the LED (120) may be exposed to join or bond with the number of second sensitive zones (123) of the LFC (124) of the proton dosimeter (200).

The proton dosimeter (200) is configured to output a frequency and a count rate corresponding to the intensity of proton radiation in a region by converting the proton induced light output of the LED (120) into a frequency through the LFC (124).

In an embodiment, the metal foil (111) is an aluminium foil of thickness 0.6 mm and is configured to provide an efficient shielding for the proton dosimeter (102), in particular to the LFC (124) from the radio-frequency field that is prevalent in a spacecraft.

In an embodiment, the polymer tape (113) is a black PVC insulation tape of thickness 0.5 mm.

In an embodiment, the acrylic polymer aliquot (125) ensures a structural integrity of the proton dosimeter (102) under high “G” (acceleration) that is prevalent during various phases of the deployment of the spacecraft. The structural integrity achieved due to the polymer aliquot thus eliminates the possibility of self-destruction of the proton dosimeter (102). The polymer aliquot also eliminates the interference with the dosimetric property of the proton dosimeter (102).

In an embodiment, the LED (120) used in the proton dosimeter (200) is a Ga (As) LED of model number LN48YPX.

In an embodiment, the LFC (124) used in the proton dosimeter (200) is of model number TSL235R.

Figure 3A:
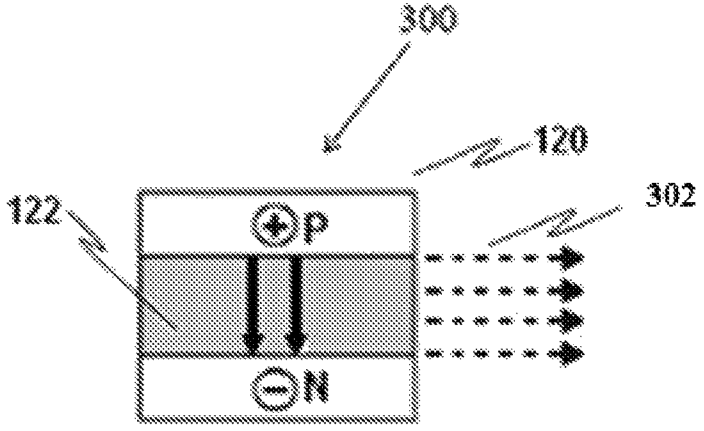
FIGS. 3*a*, 3*b* and 3*c* illustrates a dosing mechanism for dosing a proton radiation by the proton dosimeter according to an embodiment herein.
Figure 3B:
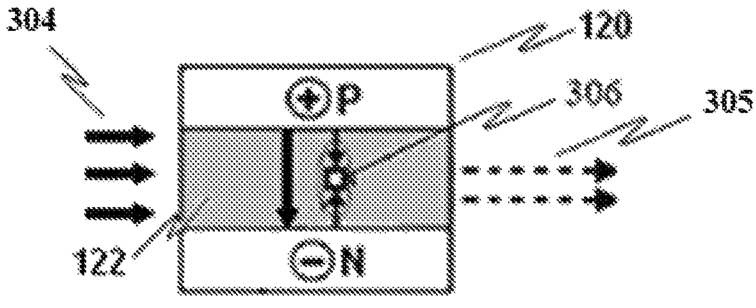
Figure 3C:
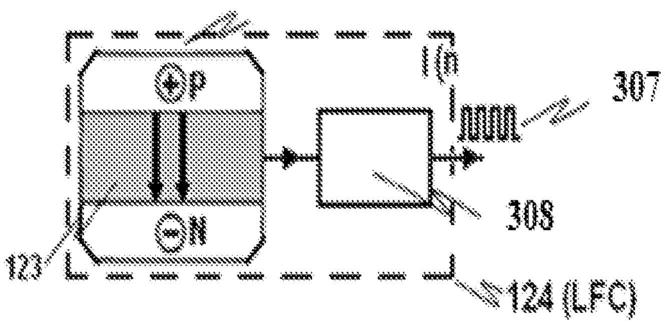

FIGS. 3*a*, 3*b* and 3*c* illustrates a dosing mechanism (300) for dosing a proton radiation by the proton dosimeter (200). The dosing mechanism (300) includes exposing the depletion zone (122) of the LED (120) to a region flooded with a proton radiation. The proton radiation is impinged on the depletion zone (122) of the LED (120). The proton radiation so impinged on the depletion zone (122) of the LED (120) is ejected as high light output (302) in the absence of non-radiative-recombination-centres as can be seen through FIG. 3*a*. The continuous impingement of the proton radiation facilitates the formation of non-radiative-recombination-centres (306) in the depletion zone (122) of the LED (120) as can be seen through the FIG. 3*b*. The formation of non-radiative-recombination-centres (306) affects the light output of the LED (120) and therefore ejected as low light output (305) as can be seen through FIG. 3*b*. The light output (305) of the LED (120) is converted into a frequency output (307) by the light-to-frequency converter LFC (124) as can be seen through FIG. 3*c*. The frequency output (307) from the LFC (124) is used for calculation of proton fluence that further may be used for predicting various risks due to the presence of certain amount of proton doses in a region.

In an embodiment, the LFC (124) is further configured with a signal conditioner (308) for conditioning the converted signals so that proton fluence calculation from the frequency output (307) of the LFC (124) becomes accurate and precise.

In an embodiment, a number of first sensitive zones (122) of the LED (120) and a number of second sensitive zones (123) of the LFC (124) are joined together by acrylic glue to form a sensitive zone interface of the LED (120) and the LFC (124) as can be seen through the dotted line of FIG. 3*c*.

In an embodiment, the sensitive zone interface of the LED (120) and the LFC (124) is wrapped by a metal foil (111) and a polymer tape (113).

In an embodiment, a gap between the metal foil (111) and a plurality of terminal leads (115) of the LED (120) and the LFC (124) are filled with acrylic polymer aliquots (125).

Figure 4A:
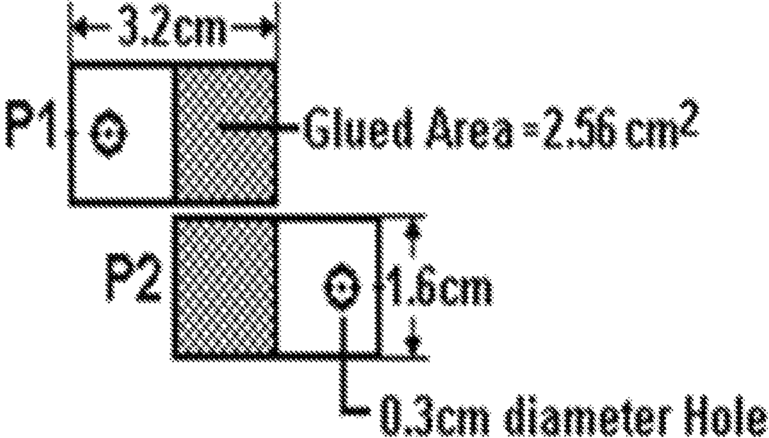
FIGS. 4A, 4B and 4C illustrates a heat and shear-stress test of the glue used in the proton dosimeter according to an embodiment herein.
Figure 4B:
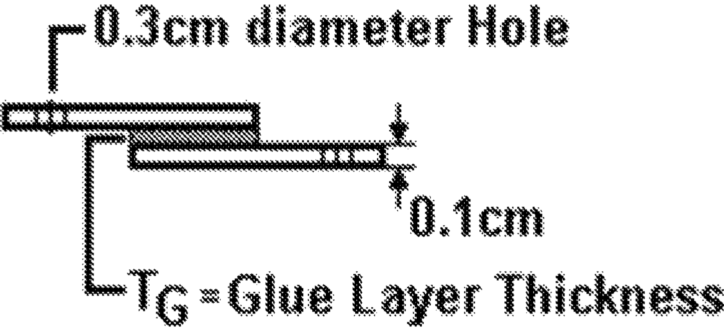
Figure 4C:
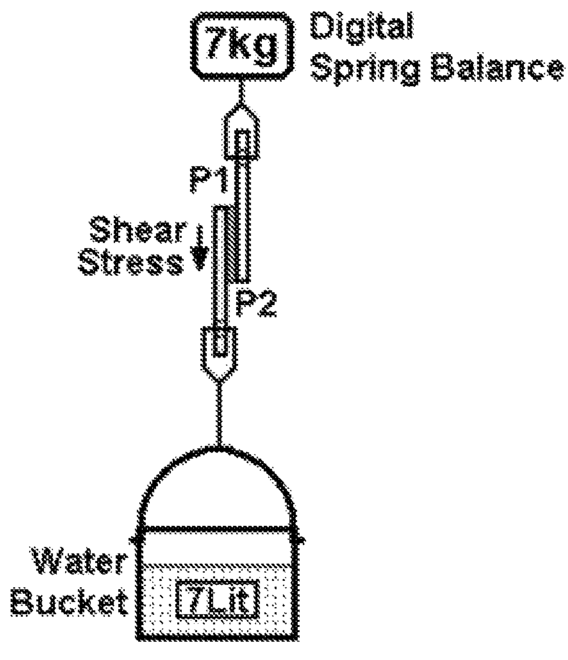

FIGS. 4A, 4B and 4C illustrates a heat and shear stress test of the glue used in the proton dosimeter (200). Since, the space payloads suffer strong G-stresses during launching phase and have to endure a continuous temperature fluctuation during their operational life in space, therefore: the consistency of the glue material is a vital parameter when the proton dosimeter (200) is used in space applications or other critical applications.

The glue is used to bond together the LED (120) and the LFC (124). In order to test the glue used in the proton dosimeter (200), an experiment was performed, the steps of which are reproduced herein below:—

(a) Sample preparation: Two pieces of plate (P1) and (P2) were cut out from a polystyrene sheet and weighed using a digital balance as can be seen through FIG. 4A. Polystyrene was used because it possesses similar physical property as acryl-glass that is used in preparing LED and LFC chips of the proton dosimeter (200).

(b) Gluing the plates (P1) and (P2): The plates (P1) and (P2) were glued together as can be seen through FIG. 4B. After a curing time of 12 hours the glued plate-pairs were weighed again.

(c) Estimation of glue layer thickness: The glue layer thickness is estimated by following method:—

$$\text{Mass of the plates: } mP1 = 05\ \text{g},\ mP2 = 05\ \text{g},\ mP1 + P2 + \text{Glue} = 1.02\ \text{g}$$

$$\text{Therefore, } mGlue = (1.02 - 0.5 - 0.5)\text{g} = 0.02\ \text{g}$$

Using the glued area to be 2.56 cm2 (from FIG. 4A) and water equivalent glue density □=1.0 $\text{gcm}^3$ The glue layer thickness TG (cm) (from FIG. 4B) was calculated to be:

$$TG = 0.02/(1.6 * 1.6)\text{cm} = 0.00078\ \text{cm} = 78\ \mu\text{m}$$

(d) Heat treatment of glued plate-pairs: The plates were stored in a freezer at a temperature of 4° C. for about 12 hours. The plates were removed from the freezer and inserted in thermo-flask containing water at a temperature of 60° C. and kept for about 12 hours.

(f) Shear-Stress Testing: Top end (P1) of plate-pair was attached to a digital spring balance by means of a stirrup made of heavy cotton material. The bottom end (P2) of the plate was connected to a 10 Litre water bucket using a similar stirrup (refer to FIG. 4C). Tap water was tipped gradually into the bucket until any eventual deformation/dislocation of the plates noticed. The system remained quite stable up to a water load of 7 Litre showing 7 kg by the spring balance was delivered. The plates were removed after 24 hours and a visual check-up was carried out. No fault in the glue interface was observed.

(g) Conclusion: Our experiment found a 78 μm thick glue layer (UHU GmbH, Germany) was able to withstand a Shear Stress of 68.6 Newton (=7 kg) after enduring a temperature regimen fluctuation (4° C. to 60° C.). This vindicates the flawless usage of the glue we already used in the construction of ROBI 2016 proton dosimeter.

Figure 5:
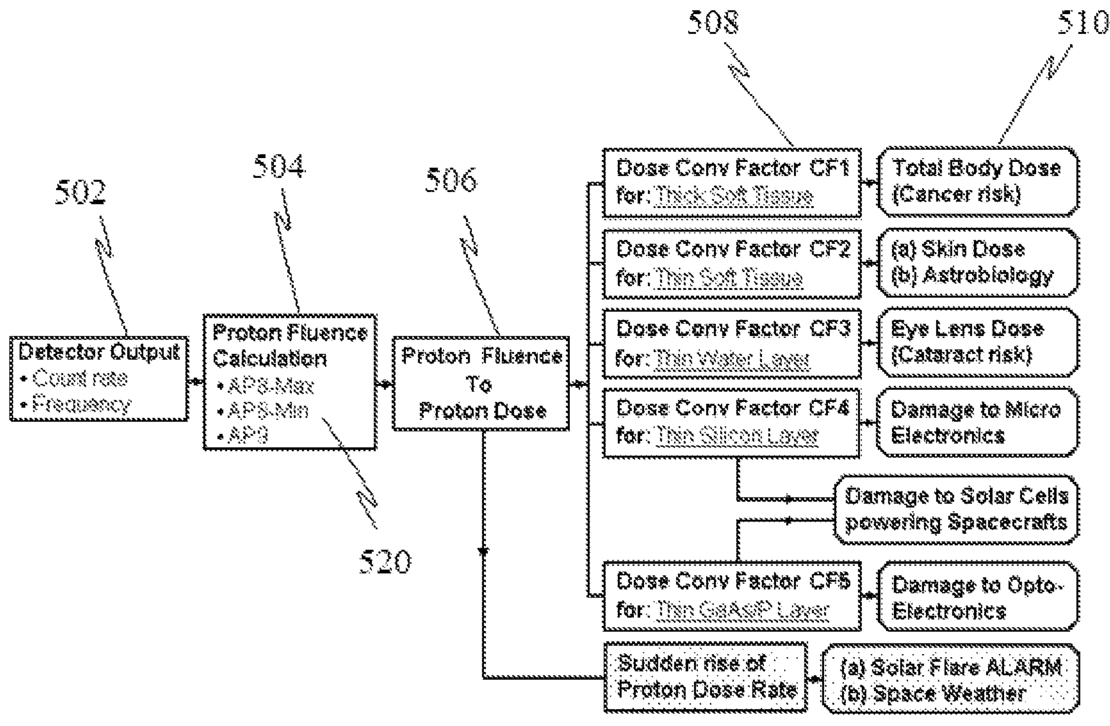
FIG. 5 illustrates a flow chart depicting a method for assessing various risk factors due to proton radiation according to an embodiment herein.

FIG. 5 illustrates a flow chart depicting a method for assessing (500) various risk factors due to proton radiation using the outputs from the proton dosimeter (200).

The method of assessing (500) various risk factors of a proton radiation includes:—

Detecting and converting (502) a proton radiation output by the LED (120) into a frequency output by the LFC (124) of the proton dosimeter (200);

Calculating (504) proton fluence by a fluence calculator (520) based on the frequency output of the LFC (124) at step (502);

Converting (506) the proton fluence as calculated in step 504, into a proton dose.

Applying (508) a number of application specific dose conversion factors (CF's) to the proton dose for assessing risks involved in various applications.

Evaluating (510) the proton dose based on a plurality of application specific proton dose conversion factors and assessing the risk factors of a proton radiation from the plurality of application specific proton dose conversion factors.

In an embodiment, the a number of first sensitive zones (122) of the LED (120) and a number of second sensitive zones (123) of the LFC (124) are bonded together by acrylic glue to prepare a sensitive zone interface of the LED (120) and the LFC (124).

In an embodiment, the sensitive zone interface of the LED (120) and the LFC (124) is wrapped with a metal foil (111) and a polymer tape (113).

In an embodiment, a gap between a plurality of terminal leads (115) of the LED (120) and the LFC (124) and the metal foil (111) is filled with acrylic polymer aliquots (125).

In an embodiment, the proton fluence may be calculated by AP8-max, AP9-min and AP9 trapped proton models developed by NASA.

In an embodiment, the conversion factors are configured for thick soft tissue for measuring total body dose to predict cancer risk, for thin soft tissue for measuring skin dose, for thin water layer for measuring eye lens dose to predict cataract risk, for thin silicon layer or Ga (As) layer for measuring damage to micro-electronics such as micro-electronics of a mobile phone, tablet, personal computer (PC) or the like, for measuring damage to solar cells used for powering space-craft.

In an embodiment, the proton dose may be monitored and sudden rise of proton dose is configured to alarm the critical situation, such as the alarm may be solar flare alarm and space weather alarm.

In an embodiment, the proton dosimeter (200) is configured for real-time dosimetry of prostate tumour during irradiation with high-energy proton beam. High-energy protons of a maximum energy of about 230 MeV generated by proton therapy medical cyclotrons are used to treat deep-seated malignant tumours, in particular prostate tumours. The primary objective of proton therapy is to deliver a highly conformal proton field to encompass only the cancerous (tumour) volume. However, part of the primary proton beam is scattered by the tumour mass and expose the highly radiosensitive rectal epithelium causing adverse bleeding risk. In order to reduce the scattered proton field by manipulating the high-energy primary proton beam the proton dosimeter (200) is used. The proton dosimeter (200)

is inserted in the rectum of the patient using a sterile catheter for in-situ monitoring of the cytotoxic proton dose at rectal epithelium.

The foregoing discussion of the present disclosure has been presented for purposes of illustration and description. It is not intended to limit the present invention to the form or forms disclosed herein. In the foregoing Detailed Description, for example, various features of the present invention are grouped together in one or more embodiments, configurations, or aspects for the purpose of streamlining the disclosure. The features of the embodiments, configurations, or aspects may be combined in alternate embodiments, configurations, or aspects other than those discussed above. This method of disclosure is not to be interpreted as reflecting an intention the present invention requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate embodiment of the present invention.

Moreover, though the description of the present disclosure has included description of one or more embodiments, configurations, or aspects and certain variations and modifications, other variations, combinations, and modifications are within the scope of the present invention, e.g., as may be within the skill and knowledge of those in the art, after understanding the present disclosure. It is intended to obtain rights which include alternative embodiments, configurations, or aspects to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method of fabricating (100) a proton dosimeter comprising;
- filing off (104) a frontal surface of a light emitting diode (LED) (120) and a frontal surface of a light-to-frequency converter (LFC) (124);
- exposing a plurality of first sensitive zone (122) of the LED (120) and a plurality of second sensitive zone (123) of the LFC (124);
- bonding (108) the plurality of first sensitive zones (122) and the plurality of second sensitive zones (123) by acrylic glue;
- wrapping (110) the sensitive zone interface of the LED (120) and the LFC (124) in a metal foil (111) and a polymer tape (113); and
- filling a gap between the metal foil (111) and a plurality of terminal leads (115) of the LED (120) and the LFC (124) with acrylic polymer aliquots (125).

2. The method (100) as claimed in claim 1, wherein the method (100) further comprising sealing the proton dosimeter by a heat-shrinking sleeve (117).

3. The method as claimed in claim 1, wherein the metal foil (111) is an aluminum foil wrapping the sensitive zone interface of the LED (120) and the LFC (124) after curing period of 30 minutes.

4. The method as claimed in claim 1, wherein the polymer tape (113) is a black PVC insulation tape.

5. The method as claimed in claim 1, wherein the LED (120) is Ga (As) LED of model number LN48YPX.

6. The method as claimed in claim 1, wherein the LFC (124) is of model number TSL235R.

7. A proton dosimeter (200) comprising;
- a light emitting diode (LED) (120) communicating with a light-to-frequency converter (LFC) (124) through a sensitive zone interface of the LED (120) and the LFC (124);
- the sensitive zone interface is prepared by joining a plurality of first sensitive zone (122) of the LED (120) and a plurality of second sensitive zone (123) of the LFC (124) by a heat resistant acrylic glue;
- wherein the sensitive zone interface wrapped in a metal foil (111) and a polymer tape (113).

8. The proton dosimeter (200) as claimed in claim 7, wherein a gap between a plurality of terminal leads (115) of the LED (120) and the LFC (124) and the metal foil (111) is filled with acrylic polymer aliquots (125).

9. The proton dosimeter (200) as claimed in claim 7, wherein the sensitive zone interface of the LED (120) and the LFC (124) is sealed using a heat-shrinking sleeve (117).

10. The proton dosimeter (200) as claimed in claim 7, wherein the LFC (124) is configured to convert the proton induced light output of the LED (120) into a frequency output.

11. The proton dosimeter (200) as claimed in claim 7, wherein the metal foil (111) is an aluminum foil wrapped around the sensitive zone interface of the LED (120) and the LFC after the curing period of 30 minutes.

12. A dosing mechanism (300) for dosing a proton radiation from a proton dosimeter (200), comprising;
- exposing a depletion zone (122) of a light emitting diode (LED) (120) of the proton dosimeter (200) to the proton radiation, wherein the proton dosimeter (200) comprises:
  - the LED (120) that communicates with a light-to-frequency converter (LFC) (124) through a sensitive zone interface of the LED (120) and the LFC (124);
  - wherein a plurality of first sensitive zones (122) of the LED (120) and a plurality of second sensitive zones (123) of the LFC (124) are joined together by acrylic glue to form a sensitive zone interface of the LED (120) and the LFC (124); and
  - wherein the sensitive zone interface of the LED (120) and the LFC (124) is wrapped by a metal foil (111) and a polymer tape (113);
- impinging the proton radiation on the depletion zone (122) of the LED (120) leads to formation of a plurality of non-radiative-recombination-centres (306) in the depletion zone (304) that further reducing the light output (305) of the LED (120);
- converting the light output (305) of the LED (120) to a frequency output (307) by a light-to-frequency converter (LFC) (124); and
- calculating a proton fluence based on the frequency output (307) of the LFC (124) of the proton dosimeter (200).

13. The dosing mechanism as claimed in claim 12, wherein the LFC (124) is further configured with a signal conditioner (308) for conditioning the converted signals.

14. The dosing mechanism (300) as claimed in claim 12, wherein a gap between the metal foil and a plurality of terminal leads (115) of the LED (120) and the LFC (124) are filled with acrylic polymer aliquots (125).

15. The dosing mechanism (300) as claimed in claim 12, wherein the LED (120) is Ga (As) LED of model number LN48YPX.

16. The dosing mechanism (300) as claimed in claim 12, wherein the LFC (124) is of model number TSL235R.

17. A method of assessing (500) risk factors of a proton radiation comprising;

detecting and converting (502) a proton radiation output of a light emitting diode (LED) (120) of a proton dosimeter (200) into a frequency output by a light-to-frequency converter (LFC) (124) of the proton dosimeter (200);

wherein the proton dosimeter (200) comprises the light emitting diode (LED) (120) communicating with the light-to-frequency converter (LFC) (124) through a sensitive zone interface of the LED (120) and the LFC (124);

wherein a plurality of first sensitive zones (122) of the LED (120) and a plurality of second sensitive zones (123) of the LFC (124) are bonded together by acrylic glue to prepare the sensitive zone interface of the LED (120) and the LFC (124);

wherein the sensitive zone interface of the LED (120) and the LFC (124) is wrapped with a metal foil (111) and a polymer tape (113);

calculating (504) proton fluence based on the frequency output of the LFC (124) of the proton dosimeter (200) by the fluence calculator (520);

converting (506) the proton fluence into a proton dose;

applying a plurality of application specific dose conversion factors to the proton dose;

evaluating (510) the proton dose based on a plurality of application specific proton dose conversion factors.

18. The method (500) as claimed in claim 17, wherein a gap between a plurality of terminal leads (115) of the LED (120) and the LFC (124) and the metal foil (111) is filled with acrylic polymer aliquots (125).

19. The method (500) as claimed in claim 17, wherein the LED (120) is Ga (As) LED of model number LN48YPX.

20. The method (500) as claimed in claim 17, wherein the LFC (124) is of model number TSL235R.

* * * * *